United States Patent
Arghavani et al.

(10) Patent No.: US 7,528,051 B2
(45) Date of Patent: May 5, 2009

(54) METHOD OF INDUCING STRESSES IN THE CHANNEL REGION OF A TRANSISTOR

(75) Inventors: Reza Arghavani, Scotts Valley, CA (US); Zheng Yuan, Fremont, CA (US); Ellie Y. Yieh, San Jose, CA (US); Shankar Venkataraman, Santa Clara, CA (US); Nitin K. Ingle, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 612 days.

(21) Appl. No.: 10/846,734

(22) Filed: May 14, 2004

(65) Prior Publication Data

US 2005/0255667 A1   Nov. 17, 2005

(51) Int. Cl.
  *H01L 21/76* (2006.01)
(52) U.S. Cl. .................... 438/424; 257/E21.546
(58) Field of Classification Search ........... 438/207, 438/218, 219, 294, 296, 353, 424–438, 778, 438/50, 285, 405, 791, 400; 257/510, 513, 257/506, 369, E21.54, E21.545, E21.546
  See application file for complete search history.

(56) References Cited

U.S. PATENT DOCUMENTS

| | | | |
|---|---|---|---|
| 5,356,722 A | 10/1994 | Nguyen et al. | |
| 5,660,472 A | 8/1997 | Peuse et al. | |
| 5,710,079 A | 1/1998 | Sukharev | |
| 5,747,377 A * | 5/1998 | Wu | 438/444 |
| 5,807,785 A | 9/1998 | Ravi | |
| 5,872,064 A * | 2/1999 | Huff et al. | 438/778 |
| 5,939,763 A | 8/1999 | Hao et al. | |
| 5,965,203 A | 10/1999 | Gabric et al. | |
| 6,106,678 A | 8/2000 | Shufflebotham et al. | |
| 6,149,987 A | 11/2000 | Pemg et al. | |
| 6,150,209 A | 11/2000 | Sun et al. | |

(Continued)

FOREIGN PATENT DOCUMENTS

TW   479315   3/2002

OTHER PUBLICATIONS

C.H. Ga, et al., "Process-Strained Si (PSS) CMOS Technology Featuring 3D Strain Engineering," 2003 IEEE (4 pages).

(Continued)

*Primary Examiner*—Khiem D Nguyen
(74) *Attorney, Agent, or Firm*—Townsend and Townsend and Crew

(57) ABSTRACT

A method of fabricating a semiconductor device, where the method includes forming a transistor on a substrate, where the transistor includes a channel region configured to conduct charge between a source region and a drain region, forming a trench adjacent to the transistor, depositing a material on the substrate and within the trench, and annealing the material, where the material is tensile following the annealing and creates a tensile stress in the channel region. Also, a method of forming a trench isolation in a semiconductor device, where the method includes forming a trench in a substrate, forming a material within the trench at a lower deposition rate, forming the material on the substrate at a higher deposition rate after the depositing of the material within the trench, and annealing the material, where after the annealing the material in the trench is tensile.

5 Claims, 9 Drawing Sheets

U.S. PATENT DOCUMENTS

| | | | |
|---|---|---|---|
| 6,150,286 | A | 11/2000 | Sun et al. |
| 6,171,901 | B1 | 1/2001 | Blair et al. |
| 6,184,155 | B1 | 2/2001 | Yu et al. |
| 6,190,973 | B1 | 2/2001 | Berg et al. |
| 6,218,268 | B1 | 4/2001 | Xia et al. |
| 6,236,105 | B1 | 5/2001 | Kariya |
| 6,245,689 | B1 | 6/2001 | Hao et al. |
| 6,248,628 | B1 | 6/2001 | Halliyal et al. |
| 6,287,938 | B2 * | 9/2001 | Lee et al. ............... 438/424 |
| 6,331,494 | B1 | 12/2001 | Olson et al. |
| 6,340,435 | B1 | 1/2002 | Bjorkman et al. |
| 6,348,421 | B1 | 2/2002 | Shu et al. |
| 6,436,833 | B1 * | 8/2002 | Pang et al. ............... 438/692 |
| 6,489,254 | B1 | 12/2002 | Kelkar et al. |
| 6,512,264 | B1 | 1/2003 | Ogle, Jr. et al. |
| 6,541,367 | B1 | 4/2003 | Mandal |
| 6,573,172 | B1 | 6/2003 | En et al. |
| 6,653,200 | B2 | 11/2003 | Olsen |
| 6,677,242 | B1 | 1/2004 | Liu et al. |
| 6,733,955 | B1 | 5/2004 | Geiger et al. |
| 6,890,808 | B2 * | 5/2005 | Chidambarrao et al. ..... 438/199 |
| 6,943,391 | B2 * | 9/2005 | Chi et al. ............... 257/254 |
| 6,949,443 | B2 * | 9/2005 | Ke et al. ............... 438/400 |
| 6,974,755 | B2 * | 12/2005 | Ko et al. ............... 438/424 |
| 2002/0000195 | A1 | 1/2002 | Bang et al. |
| 2002/0052128 | A1 | 5/2002 | Yu et al. |
| 2002/0102358 | A1 | 8/2002 | Das et al. |
| 2003/0057432 | A1 | 3/2003 | Gardner et al. |
| 2003/0071304 | A1 | 4/2003 | Ogle, Jr. et al. |
| 2003/0073290 | A1 | 4/2003 | Ramkumar et al. |
| 2003/0140851 | A1 | 7/2003 | Janakiraman et al. |
| 2004/0083964 | A1 | 5/2004 | Ingle et al. |
| 2004/0212035 | A1 * | 10/2004 | Yeo et al. ............... 257/510 |
| 2004/0232513 | A1 * | 11/2004 | Chi et al. ............... 257/510 |
| 2004/0253791 | A1 * | 12/2004 | Sun et al. ............... 438/308 |
| 2005/0224798 | A1 * | 10/2005 | Buss ............... 257/65 |

OTHER PUBLICATIONS

Ke-Wei Su et al., "A Scaleable Model for STI Mechanical Stress Effect on Layout Dependence of MOS Elecgrical Characteristcis," 2003 IEEE Custom Integrated Circuits Conference, pp. 245-248.

Y.M. Sheu et al., "Study on STI Mechanical Stress Induced Variations on Advanced CMOSFETs," 2003 IEEE, pp. 205-208.

R. Arghavani et al., "Stress Management in Sub-90nm Transistor Architecture," unpublished, Applied Materials, (7 pages).

T. Ghani et al., "A 90nm High Volume Manufacturing Logic Technology Featuring Novel 45 nm Gate Length Strained Silicon CMOS Transistors," 2003 IEEE (3 pages).

Victor Chan et al., "High Speed 45nm Gate Length CMOSFETs Integrated Into a 90nm Bulk Technology Incorporating Strain Engineering," 2003 IEEE (4 pages).

F. Baker, et al. "STI TEOS Densification for Furnaces and RTP Tools" 1999 IEEE/SEMI Advanced Semiconductor Manufacturing Conference, 1999, pp. 394-399.

Applied Materials Website Printout: "SACVD (Sub-Atmospheric Chemical Vapor Deposition)" from www.appliedmaterials.com/products/sacvd.html, printed Jun. 20, 2003.

Romanelli, Alex Semiconductor International website article: AMD Details 45nm Technology, at www.e-insite.net/semiconductor/; Jun. 12, 2003.

Fujino et al., "Dependence of Deposition Characteristics on Base Materials in TEOS and Ozone CVD at Atmospheric Pressure," *J. Electrochem. Soc.*, 138(2):550-554 (1991).

Kwok et al., "Surface Related Phenomena in Integrated PECVD / Ozone-TEOS SACVD Process for Sub-Half Micron Gap Fill: Electrostatic Effects," *J. Electrochem. Soc.*, 141(8):2172-2177 (1994).

* cited by examiner

METHOD OF INDUCING STRESSES IN THE CHANNEL REGION OF A TRANSISTOR

BACKGROUND OF THE INVENTION

Despite significant challenges to device scaling, Moore's Law has continued to be a driver for the semiconductor industry. In order to continue conventional CMOS device scaling to its extreme theoretical limit and to keep Moore's Law on track, technologists are using strain engineering to further enhance and extend device performance. As opposed to junction engineering, gate oxide scaling or poly CD reduction, strain engineering alone is able to deliver enough performance boost to enable Moore's Law beyond the 90 nm node.

The nearly 4.2% lattice mismatch between single crystal Ge and Si lattice structure has been the foundation of strain engineering in the silicon industry. The electronic conduction and valence band structure of SiGe was well established following the early preparation of homogenous SiGe alloys nearly four decades ago. The advent of pseudomorphic deposition of Si on $Ge_xSi_{1-x}$ extended this understanding to strained lattice structure and enabled examination of electrical characteristics of strained Si.

The work predicted strained Si to have higher carrier mobility compared to the relaxed Si lattice structure. The enhanced mobility in strained Si is partly due to reduced inter valley phonon scattering and lower effective mass. The induction of localized strain via deposition of dielectric films is an alternative form of inducing localized stress in the channel of sub-90 nm devices. Such films as salicide, oxide and nitride spacers can affect device performance by inducing strain in addition to other effects.

Despite its compressive nature and degradation in NMOS mobility, High Density Plasma Chemical Vapor Deposition (HDP-CVD) is currently the most commonly used gapfill technology for shallow trench isolation (STI) applications due to ease of polishing and superior wet etch rate results. Moving forward however, the issue of stress and the degradation of NMOS mobility caused by films deposited via HDP technology could be a significant process disadvantage as geometries shrink. For example, although STI depth has remained nearly constant in the past few technology nodes, the pitch in a 65 nm node could be as aggressive as <200 nm. Combined with an estimated poly pitch of less than 200 nm, trench processing can induce significant stress in the channel of the minimum design rule structures.

Considerable reduction of NMOS Idsat is observed as the device width decreases, for a given device length. This indicates that the effect of HDP compressive stress is more profound on the NMOS device performance, while PMOS performance remained unaffected by decreasing width. Thus there remains a need for materials and processes to fill gaps in STI applications that enhance, rather than degrade, the performance of NMOS devices. There also remains a need for materials and processes that enhance NMOS while not degrading the performance of PMOS devices.

BRIEF SUMMARY OF THE INVENTION

One embodiment of the invention includes a method of fabricating a semiconductor device. The method includes forming on a transistor on a substrate, where the transistor includes a channel region configured to conduct charge between a source region and a drain region. The method also includes forming a trench adjacent to the transistor, and depositing a material on the substrate and within the trench. The method further includes annealing the material, where the material is tensile following the annealing and creates a tensile stress in the channel region.

Another embodiment of the invention includes a semiconductor device that includes a transistor having a channel region to conduct charge between a source region and a drain region. The device also includes a trench adjacent to the transistor, where the trench contains a tensile silicon oxide that creates a tensile stress in the channel region.

Another embodiment of the invention includes a method of forming a trench isolation in a semiconductor device. The method includes forming a trench in a substrate, and forming a material within the trench at a lower deposition rate, followed by forming the material on the substrate at a higher deposition rate after the depositing of the material within the trench. The method also includes annealing the material, where, after the annealing, the material in the trench is tensile.

Additional features are set forth in part in the description that follows, and in part will become apparent to those skilled in the art upon examination of the following specification or may be learned by the practice of the invention. The features and advantages of the invention may be realized and attained by means of the instrumentalities, combinations, and methods particularly pointed out in the appended claims.

DETAILED DESCRIPTION OF THE INVENTION

As noted above, charged carriers experience less scattering, and therefore travel faster, through silicon that has been strained by tensile (or compressive) forces. Thus, increased speeds can be realized in transistors where the charge transport region (here referred to as the channel region) includes strained silicon that reduces the scatter of charged carriers through the region.

Embodiments of the present invention include the fabrication of semiconductor transistors where tensile strain is added to a channel region in the transistor through tensile materials deposited in nearby trenches. In one transistor design according to an embodiment of the invention, the trenches are formed adjacent to the source and drain regions that define opposite ends of the channel region. Materials are deposited in the trenches that exert tensile stress on the adjacent source and drain regions, which in turn create (and enhance) tensile strain in the channel region.

An unexpected aspect of the present invention is the ability of the tensile materials in the trenches to magnify tensile stress in the channel region. For example, materials that are about 200 MPa tensile in the trenches can generate tensile stresses of about two times larger or more in the channel region.

While some increase in tensile strain is predicted by the tensile forces exerted by the trenches, such an unexpectedly large increase may be more appropriately described as a magnification of the tensile stress in the channel region. Embodiments of the present invention magnify tensile stress in a channel up to two times the original strain generated by the tensile materials formed in the trenches. In some instances the channel region strain magnification may be more than about two times.

The strain magnification of the present invention may be focused along a single axis (i.e., uniaxial) of the transistor channel region. This permits one type of charge carrier (e.g., electrons) to travel faster through the channel region without degradation of the conduction speed for another type of charge carrier (e.g., holes). For example, NMOS transistors that take advantage of the increased tensile strain in the channel regions in one direction may be placed on the same film as PMOS transistors having channel regions aligned in a substantially orthogonal direction. Using the same film for both NMOS and PMOS devices eliminates the need for an extra mask.

Figure 1A:
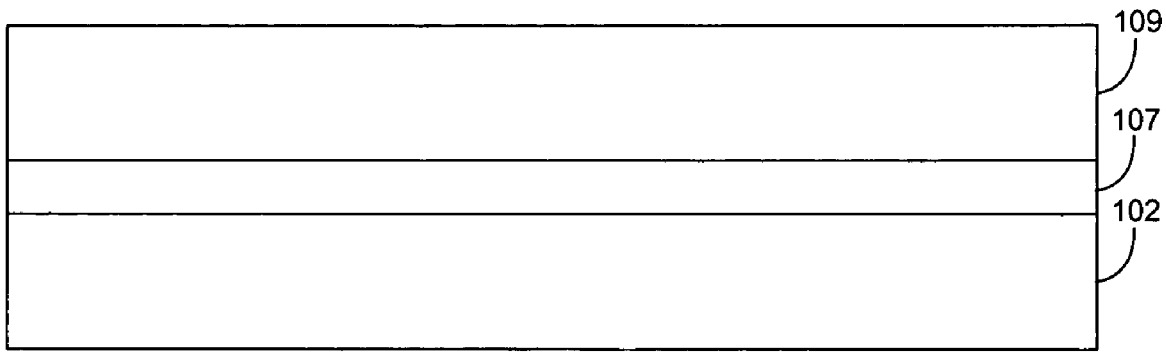
FIGS. 1A-E show the fabrication of a filled trench structure according to an embodiment of the invention.

Referring now to FIGS. 1A-E, a trench that has been formed and filled using a shallow trench isolation (STI) process according to an embodiment of the invention is shown. As shown in FIG. 1A, the formation of the trench starts with layered structure made up of a nitride layer 109 formed on pad-oxide layer 107, which is formed on substrate 102 (e.g., a silicon substrate).

Figure 1B:
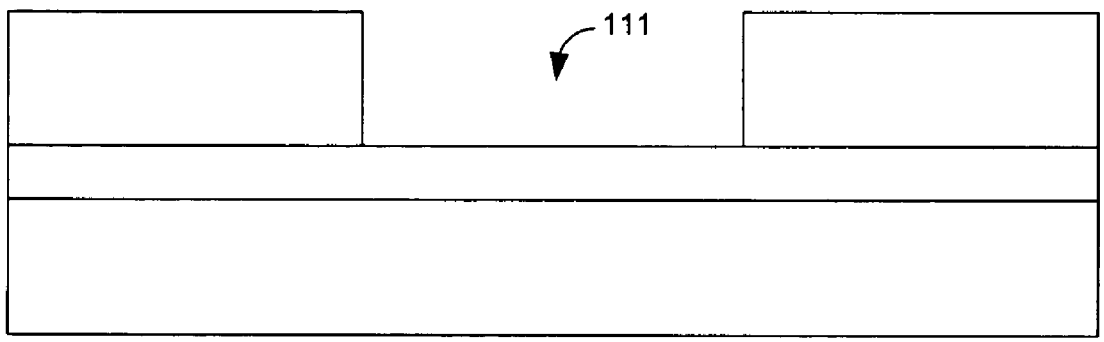
Figure 1C:
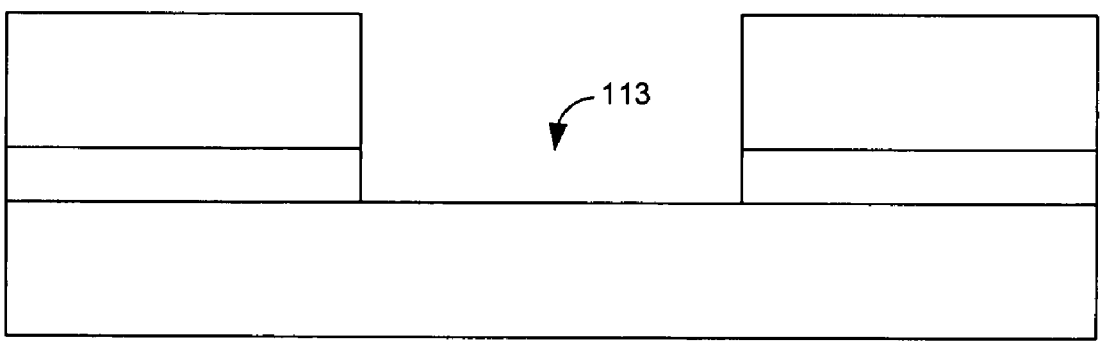

FIG. 1B shows the formation of a first gap 111 in nitride layer 109. The gap 111 may be formed by depositing and patterning a photoresist layer (not shown) on the nitride layer 109 such that a portion of the nitride layer 109 overlying gap 111 is exposed. A nitride etch is then performed to remove the exposed portion of the nitride layer 109, forming gap 111.

After the gap 111 is formed in the nitride layer 109, a second gap 113 may be formed in the pad-oxide layer 107. In this step, nitride layer 109 may act as a mask layer during an oxide etch of the underlying oxide layer 107 that is exposed by first gap 111. The oxide etch removes the exposed portion of oxide layer 107, forming gap 113.

Figure 1D:
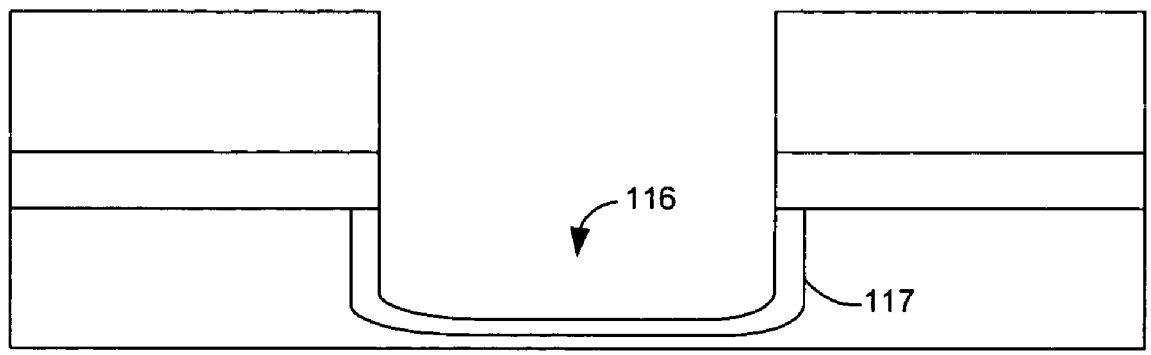

Following the formation of oxide layer gap 113, the shallow rest of the shallow trench may be formed in the substrate layer 102 as shown in FIG. 1D. This step may start with a substrate etch (e.g., a silicon etch) of substrate layer 102, with nitride layer 109 and pad-oxide layer 107 acting as etch mask layers. Following the substrate etch, the trench 116 that is formed may be cleaned with cleaning agents (e.g., HF). In addition, a trench side wall liner 117 may be formed in trench 116 by performing, for example, a rapid thermal oxidation (RTO) (e.g., 1000° C.) in an oxide/oxinitride atmosphere, which may also round sharp corners on the trench (and elsewhere).

Figure 1E:
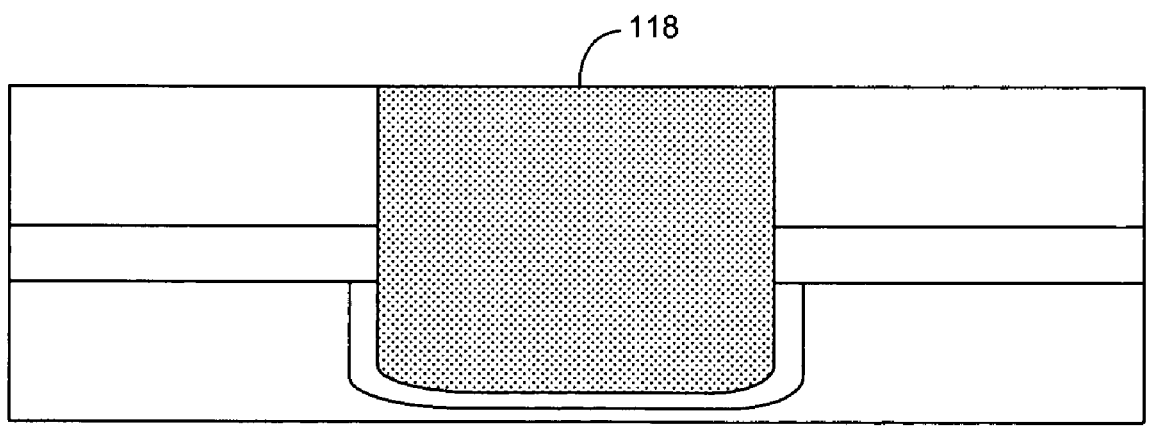

With the trench formed, tensile material 118 may be deposited as shown in FIG. 1E. The trench may be filled with tensile material 118 using a High Aspect Ratio Process (HARP). In one embodiment tensile material 118 is a silicon oxide material and the HARP includes using an $O_3$/tetraethoxy silane (TEOS) based sub-atmospheric chemical vapor deposition (SACVD) trench fill process like the ones described in commonly assigned U.S. patent application Ser. No. 10/247,672, filed on Sep. 19, 2002, entitled "METHOD USING TEOS RAMP-UP DURING TEOS/OZONE CVD FOR IMPROVED GAP FILL," and/or U.S. patent application Ser. No. 10/757,770, filed on Jan. 14, 2004, entitled "NITROUS OXIDE ANNEAL OF TEOS/OZONE CVD FOR IMPROVED GAPFILL," and/or U.S. patent application Ser. No. 10/057,280, filed on Jan. 25, 2002, entitled "GAS DISTRIBUTION SHOWERHEAD," and/or U.S. patent application Ser. No. 10/674,569, filed on Sep. 29, 2003, entitled "GAS DISTRIBUTION SHOWERHEAD," the entire contents of each of which are herein incorporated by reference.

The HARP process may include varying the ratio of Si (e.g., TEOS) to $O_3$, and the spacing between the substrate wafer and gas distribution plate (e.g., showerhead) over the course of the deposition of the gap materials. In the initial stages of a HARP deposition, the deposition rate may be lower by having a reduced concentration of Si relative to $O_3$ (e.g., a lower TEOS to $O_3$ ratio) and more spacing between the wafer a gas distribution plate (e.g., about 300 mils). The low deposition rate allows a more even trench fill with a reduced chance of forming voids due to, for example, bread-loafing of the fill material around the top corners of the trench.

In later stages of the HARP deposition after the trench is substantially filled, the deposition rate may be increased by increasing the concentration of Si relative to $O_3$ (e.g. a higher TEOS to $O_3$ ratio) and reducing the space between the wafer and gas distribution plate (e.g., spacing of about 100 mils), among other adjustments. This allows the more rapid deposition of the materials, which increases overall production efficiency by decreasing the deposition time. Thus, HARP depositions may include both a slower deposition rate stage when the slower rate is advantageous for reducing defects, and a higher deposition rate stage when the high rate results in shorter deposition times.

HARP depositions may be advantageous for gapfill depositions of trenches with high aspect ratios. The trench aspect ratio is the ratio of trench height (i.e., depth) to trench width, and trenches with high aspect ratios (e.g., about 6:1 or more) are more prone to develop voids during a gap fill process.

In some embodiments of the deposition of tensile material 118, the pressure is maintained at sub-atmospheric pressures. In a specific embodiment, the pressure during the deposition process may range from about 200 torr to less than about 760 torr, although the pressure profile may remain within a much narrower range. In some embodiments the temperature is varied from about 400° C. to about 570° C., although the temperature may be maintained within a narrower range. Regulating the temperature and pressure of the chamber regulates a reaction between the silicon-containing process gas and the oxidizer-containing process gas.

Following the deposition, tensile materials 118 may be annealed in an atmosphere such as $N_2$, $N_2O$, NO or $NH_3$ to adjust the level of tensile stress that the material exerts on the walls of the trench and, in turn, the channel region. In one embodiment, the annealing process includes heating the substrate and flowing $N_2O$ into the chamber or furnace. The $N_2O$ interacts with the $SiO_2$ network at high temperatures and strengthens any weak seams formed during the deposition process. The resulting $SiO_2$ layer is seam-free and suited for CMP.

Annealing may take place in situ or ex situ. For example, if oxide layer deposition takes place in a CVD chamber, annealing may take place in the same chamber immediately thereafter. Annealing alternatively may take place in another chamber of a multi-chamber system or in a different chamber system (e.g., a furnace). In some embodiments, annealing comprises a Rapid Thermal Process (RTP) as more fully described in U.S. Pat. No. 5,660,472, the entire disclosure of which is herein incorporated by reference for all purposes.

The annealing temperature may range from about 750° C. to about 1000° C. for furnace anneal and up to about 1200° C. for RTP anneal. The annealing duration is temperature dependent and may range from about 10 minutes to around 2 hours for furnace anneal and as few as 5 seconds up to around 3 minutes for RTP. As a result, in most cases, the layer is annealed by restructuring the $SiO_2$ network without exceeding the $SiO_2$ reflow temperature.

During the $N_2O$ anneal process, a thin layer of silicon nitride and/or silicon oxynitride may be formed in the $SiO_2$/Si interface. This layer may prevent further oxidation into the Si in which the trench is formed. This is particularly useful for wet anneal processes since the water vapor may otherwise penetrate into the Si layer, leading to excessive oxidation. Another advantage to the $N_2O$ anneal process is that it provides integrity of the top corners of STI trenches.

Exemplary Transistor

Figure 2A:
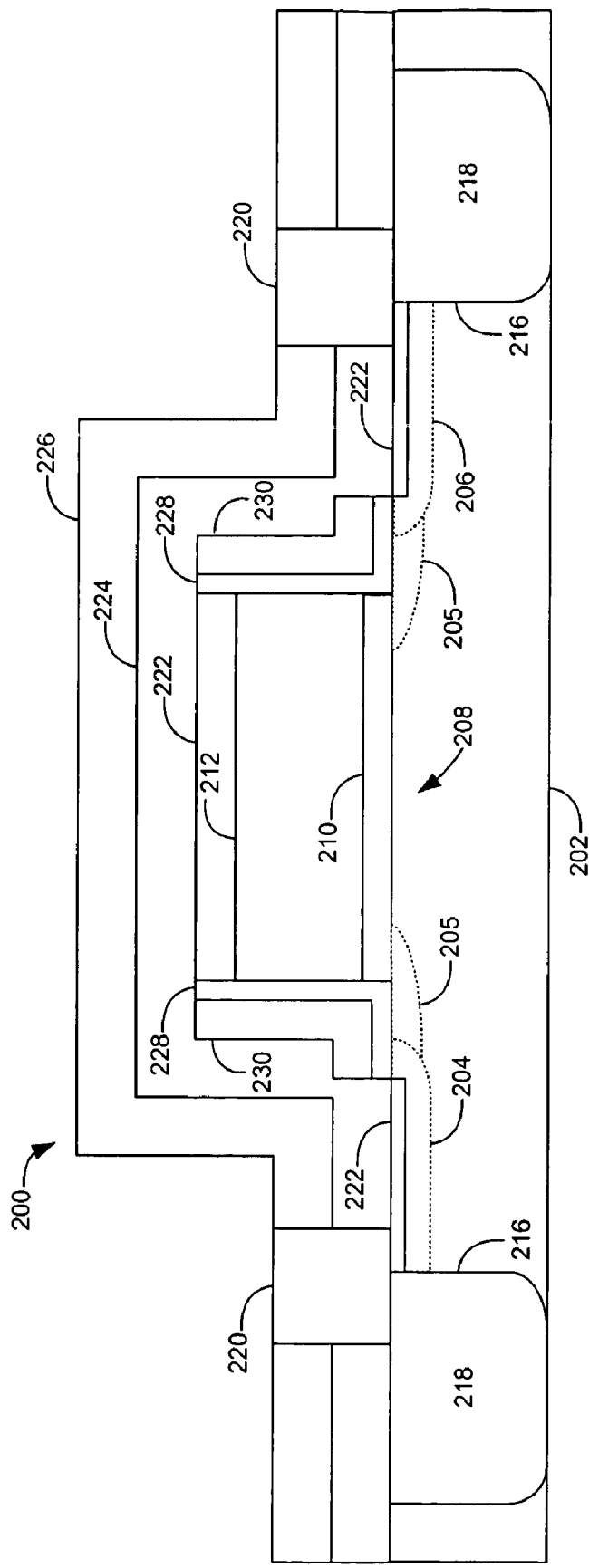
FIG. 2A shows a simplified cross section of a transistor according to an embodiment of the invention.

FIG. 2A shows a simplified cross-sectional view of an exemplary transistor 200 according to embodiments of the invention. Transistor 200 may be a Metal Oxide Silicon Field Effect Transistor (MOSFET) that includes a substrate 202 (e.g., a silicon substrate) that has implanted source region 204 and drain region 206 bordering opposite ends of channel region 208. On top of substrate 202 is gate oxide layer 210 and a gate electrode 212 formed on top of oxide layer 210. For an n-MOSFET (i.e., NMOS) structure, the source and drain regions 204 and 206 are formed by doping substrate 202 with an n-type semiconductor.

Trench 216 may be formed prior to the source and drain regions 204 and 206 by a conventional silicon etch process. Trench 216 may be formed adjacent to the sites for the source and drain regions 204 and 206. For example, the trench formation may start with forming and patterning a photoresist layer (not shown), followed by etching to remove portions of an etch stop layer (not shown), and pad oxide layers when present, exposed by the photoresist layer. The photoresist layer may then be removed and the portions of the silicon substrate not covered by the etch stop layer may be etched away to form trench 216. As noted above, a trench side wall liner (not shown) may also be formed in trench 216 by performing, for example, undergo a rapid thermal oxidation (RTO) (e.g.,. 1000° C.) in an oxide/oxinitride atmosphere, which may also round sharp corners on the trench (and elsewhere).

Tensile material 218 may be deposited in the trench 216 according to, for example, a conventional shallow trench isolation (STI) process. As noted above, the deposition of tensile material 218 may include the use of a High Aspect Ratio Process (HARP). The HARP may include, for example, using an $O_3$/tetraethoxy silane (TEOS) based sub-atmospheric chemical vapor deposition (SACVD) trench fill process. Following the deposition, excess tensile material may be removed from the surface of substrate 202 by, for example, chemical mechanical polishing (CMP).

Silicide layers 222 may be formed on top of source and drain regions 204 and 206, and gate electrode 212 in a silicidation process. They are highly conductive compared to the underlying source-drain regions and gate electrode 204, 206 and 212, and facilitate the transfer of electric signals through contacts 220 to and from transistor 200. Depending on the materials and formation processes used, the silicide layers may induce tensile strain in channel region 208.

Spacers 230 and oxide-pad layers 228 may be located on opposite sidewalls of gate electrode 212 to keep the silicide layers 222 separated in during a silicidation process. During silicidation, a continuous metal layer (not shown) is deposited over the oxide-containing source-drain regions and gate electrode 204, 206 and 212, as well nitride containing spacers 230. The metal reacts with the underlying silicon in the source-drain regions and gate electrode 204, 206 and 212 to form metal-silicon alloy silicide layers 222, but are less reactive with the nitride materials in spacers 230. Thus, spacers 230 allow the overlying, unreacted metal to be etched away while not affecting the metal alloy in silicide layers 222.

The channel length of channel region 208 is shorter than the gate length of gate oxide layer 210. The length of channel region 208 measured between the edges of the source and drain regions 204 and 206 may be about 90 nanometers or less (e.g., from about 90 nm to about 10 nm). As the length of channel region 208 gets smaller, implants 205 (e.g., halos) may be counterdoped into the channel region 208 to prevent charge carriers from uncontrollably hopping from the source region 204 to drain region 206 (and vice versa).

A nitride layer (e.g., $Si_3N_4$) 224 may be formed on transistor 200. In some instances, nitride layer 224 may act as a contact-etch stop layer. Strain exerted on the components of transistor 200 by nitride layer 224 may be tuned from tensile to compressive. When the nitride layer 224 exerts tensile stress on the transistor, the underlying silicon becomes compressive and the channel region 208 becomes tensile.

Nitride layer 224 may be formed at temperatures around 400° C. by combining silicon sources and $NH_3$ to deposit a conformal nitride layer. In one embodiment, the formation of nitride layer 224 may also include the incorporation of hydrogen into the forming layer to generate N—H and Si—H bonds in addition to the dominant Si—N bonds. While not intending to be held to a particular theory, it is believed that increasing the number of Si—H bonds in the nitride layer weakens the strength of the Si—N bonds attached to the same Si atom, which (on a macro scale) stretches the nitride film and makes it more tensile.

Following the formation of nitride layer 224, a dielectric layer 226 (also referred to as a pre-metal dielectric (PMD) layer) may be deposited on the nitride layer. The PMD layer may be, for example, borophosphosilicate glass (BPSG), phosphosilicate glass (PSG), borosilicate glass (BSG), and phosphosilicate glass (PSG), among other materials. Dielectric layer 226 may be formed using HARP that includes $O_3$/TEOS in conjunction with SACVD. The dielectric layer 226 may exert a tensile strain on the underlying channel region 208.

Figure 2B:
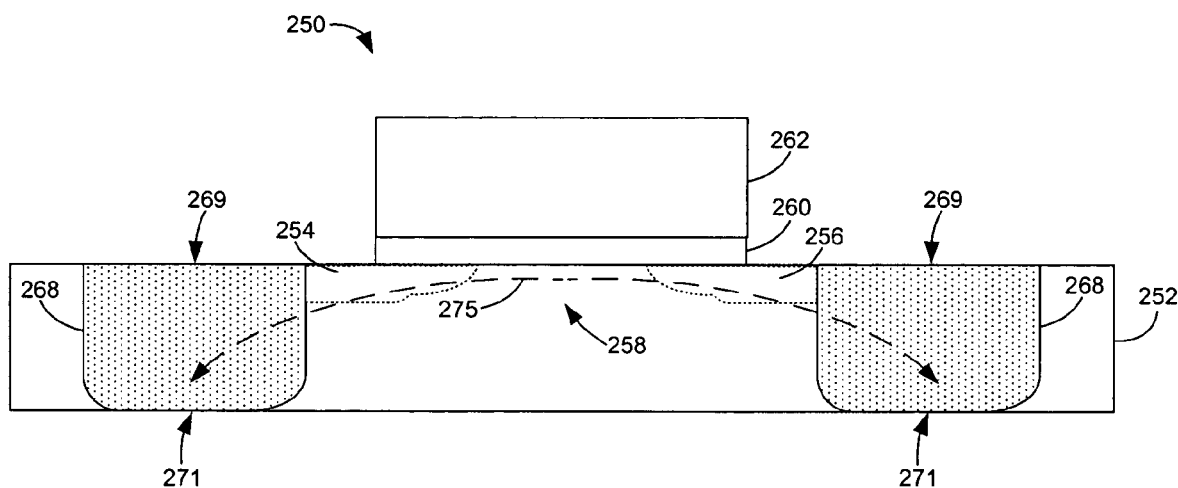
FIG. 2B shows another simplified cross-section of a transistor according to an embodiment of the invention.

FIG. 2B shows another simplified cross-section of a transistor 250 according to embodiments of the invention that shows the tensile stresses 275 in channel region 258 that are created by the tensile materials in trenches 268. The pair of trenches 268 are located in substrate 252 adjacent to source region 254 and drain region 256, respectively, which define opposite ends of channel region 258 located under gate oxide 260 and gate electrode 262.

The trenches 268 may have an aspect ratio of about 6:1 or more, a width of about 130 nm or less (e.g., about 90 nm or less), and include a top end 269 and a bottom end 271. Materials may be deposited into trenches 268 using, for example, a HARP technique adjusted to form the materials in the trench with a tensile stress of, for example, about 200 MPa or more. Following the deposition of the tensile materials, an anneal may be performed that creates a tensile stress gradient in the materials. The gradient may have increasing tensile stress of the materials in trenches 268 starting from the top end 269 to the bottom end 271 of the trenches 268. The annealed materials with the highest tensile stresses may have a tensile stress equal to or greater than the tensile stress of pre-annealed materials (e.g., the annealed materials may have tensile stress of about twice, about three-times, or about four-times or more the tensile stress of the pre-annealed materials). In addition, the materials deposited above the top end 269 on substrate 252 (not shown) may turn from tensile to compressive following the anneal.

The tensile stress gradient in the materials in trenches 268 may create tensile stress 275 in the channel region 258 that has both a latitudinal component and a longitudinal component orthogonal (i.e., perpendicular) to the latitudinal component. The latitudinal component may be the tensile stress component that is collinear (or coplanar) with a top surface of the substrate, while the longitudinal may be collinear (or coplanar) with the direction from the top end 269 to the bottom end 271 of the trenches 268.

As shown in FIG. 2B, the sum of the latitudinal and longitudinal stress components create tensile stress 275 in the channel region 258. Stresses from other sources may also be present in the channel region, so tensile stress 275 may not represent the total tensile stress in channel region 258.

Exemplary Methods

Figure 3:
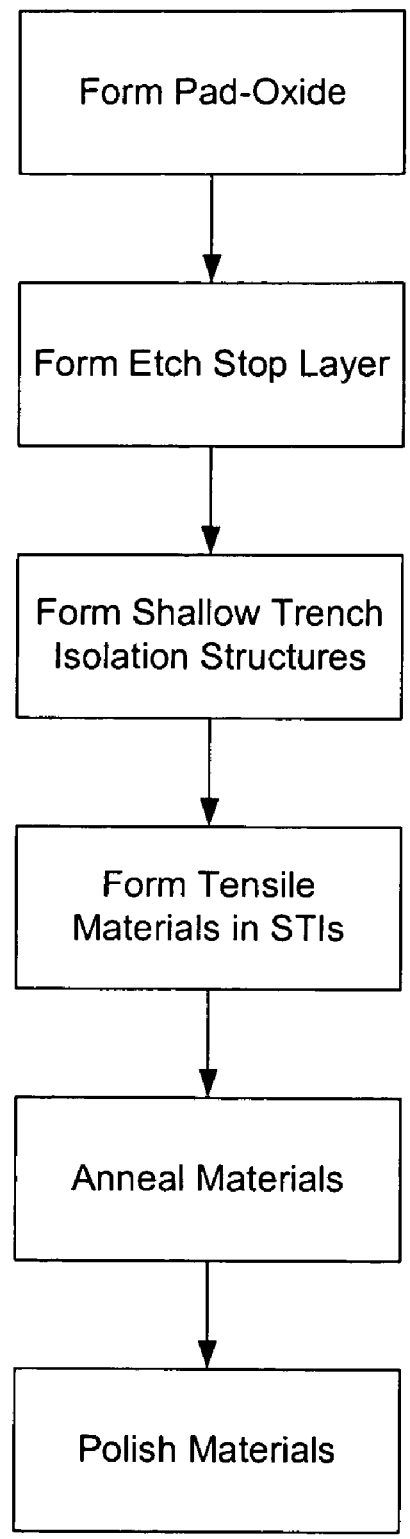
FIG. 3 shows a flowchart of a method of forming and filling an trench structure according to an embodiment of the invention.

FIG. 3 shows a flowchart illustrating process steps for making and filling a STI structure according to an embodiment of the invention. The process starts with the forming of a pad-oxide layer on the transistor surfaces followed by the forming of a nitride etch-stop layer over the pad oxide layer.

The nitride etch-stop layer act as a mask for the next step: forming the shallow trench isolation structures in the transistor's silicon substrate. As noted above, the STI structures may be formed through conventional processes such as forming and patterning a photoresist over the etch-stop layer, followed by etching to remove the portions of the layer (and underlying pad-oxide layer) exposed by the pattern in the photo resist layer. The resist may then be removed and those portions of the silicon substrate no longer covered by the nitride layer are etched away to form the STI structures. The STI structures formed may have an aspect ratio (i.e., height to width ratio) of about 6:1 or more.

After the STI structures are formed, the device may undergo a post-etch cleaning step (not shown) to remove debris including the etched silicon removed to form the STI structures. In addition, the device may also undergo an optional step (not shown) of rapid thermal oxidation (RTO) at low DT in an oxide/oxinitride atmosphere to round sharp corners on the STI structures (and elsewhere).

Once the STI structures are formed, the next step may be to deposit tensile materials in the trenches. In one embodiment, tensile materials are formed in the STI structures using a HARP process that includes SACVD deposition of $O_3$/TEOS materials as described above.

The tensile materials initially deposited in the STI structures may exert a tensile strain up to about 200 MPa. However, for some tensile materials, the stress may change from tensile to compressive as the material absorbs moisture from the air. This change can be minimized (and sometimes avoided altogether) by annealing the tensile material after the deposition. In other embodiments, the tensile materials may exert compressive stress on the surface of the substrate, but exert tensile stress in the STI structures.

The annealing step may include annealing the tensile material in an inert gas atmosphere and/or an atmosphere that includes a nitridizing agent (e.g., $N_2$, $N_2O$, NO or $NH_3$) to stabilize tensile strain in the material. Following the anneal, the next step may be to polish the substrate to remove a portion of the tensile material above a top surface of the substrate.

Figure 4:
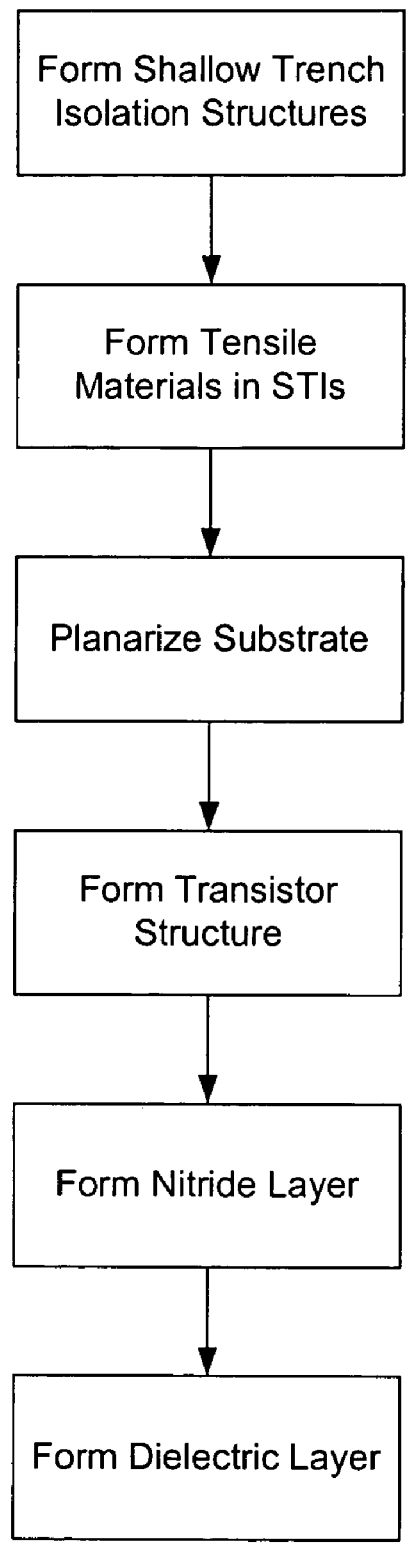
FIG. 4 shows a flowchart of a method of forming a semiconductor device according to an embodiment of the invention.

FIG. 4 shows a flowchart illustrating method steps for making a semiconductor device according to an embodiment of the invention. The method starts by forming and STI and then forming the tensile materials in the STI structure similar to the method illustrated above. The substrate may then be planarized to remove a portion of the tensile materials above a top surface of the substrate using, for example, chemical mechanical polishing (CMP).

In another step, more elements of a transistor structure may be formed, including source and drain region, and a gate electrode region. Silicide layers may be formed above the source, drain and gate electrode regions.

In another step, a nitride layer may be formed above the transistor structure and STIs. The nitride layer may be formed at temperatures of around 400° C. using a combination of silicon source gas (or gases) and $NH_3$. The materials and process parameters (e.g., temperature, gas flow rates, etc.) may be adjusted to tune the type and magnitude of strain exerted by the nitride layer on the underlying transistor. For example, controlled amounts of hydrogen may be introduced during the formation of the nitride layer to adjust the tensile strain created by the layer.

In another step, one or more dielectric layers may be formed on the nitride layer. The dielectric layer (e.g., a PMD layer) may be formed using a HARP process and may exert additional tensile strain that is transmitted to the channel region of the underlying transistor.

Exemplary Substrate Processing System

Figure 5A:
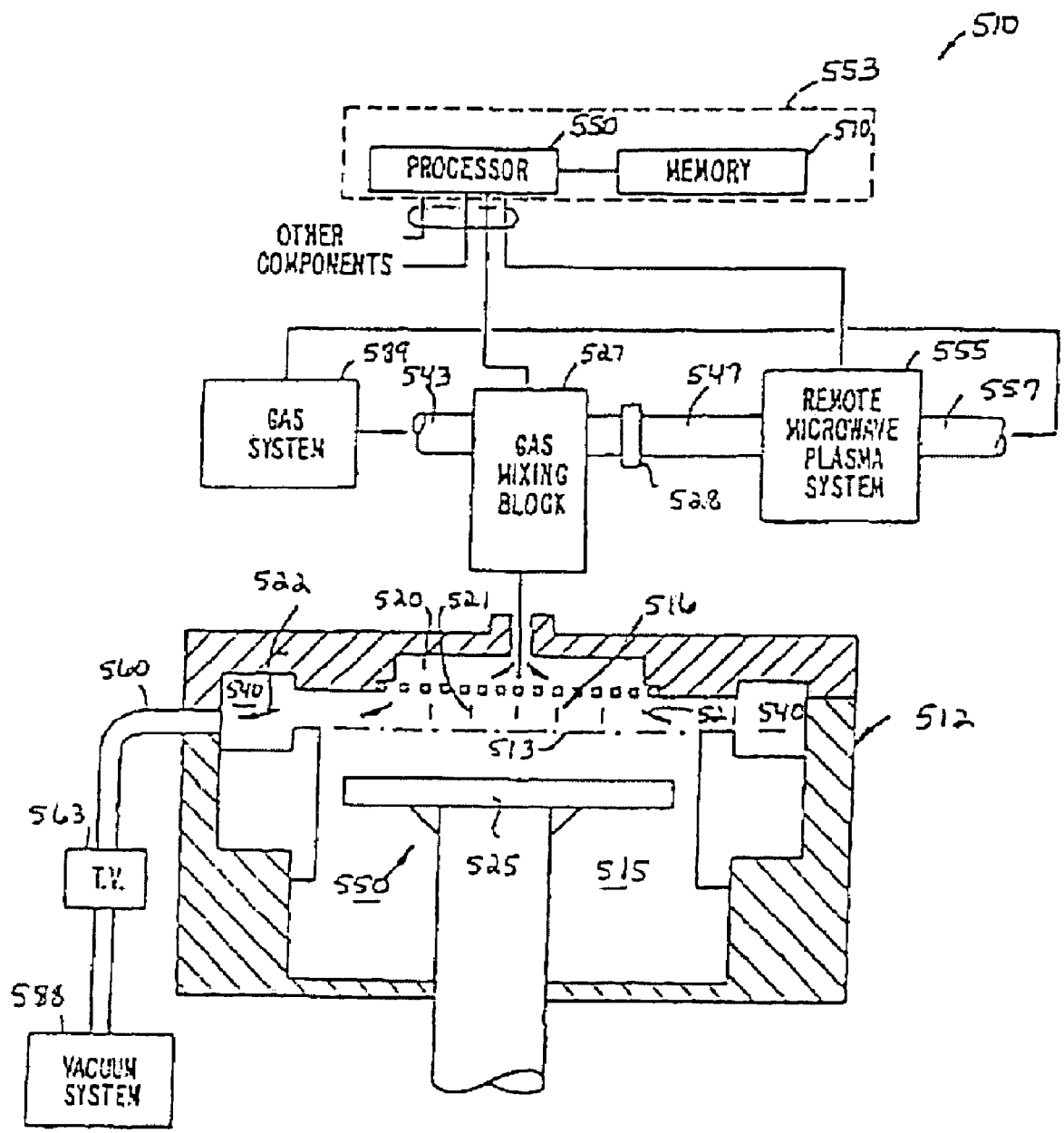
FIG. 5A shows a simplified representation of a CVD apparatus according to embodiments of the present invention.

Having described semiconductor devices and methods of making them according to embodiments of the present invention, attention is directed to FIG. 5A, which illustrates a simplified diagram of a CVD system 510 according to an embodiment of the present invention. This system is suitable for performing thermal, SACVD processes, as well as other processes, such as reflow, drive-in, cleaning, etching, and gettering processes. Multiple-step processes can also be performed on a single substrate or wafer without removing the substrate from the chamber. The major components of the system include, among others, a vacuum chamber 515 that receives process and other gases from a gas delivery system 589, a vacuum system 588, a remote microwave plasma system 555, and a control system 553. These and other components are described below in order to understand the present invention.

The CVD apparatus 510 includes an enclosure assembly 512 housing a vacuum chamber 515 with a gas reaction area 516. A gas distribution plate 520 is provided above the gas reaction area 516 for dispersing reactive gases and other gases, such as purge gases, through perforated holes in the gas distribution plate 520 to a wafer (not shown) that rests on a vertically movable heater 525 (also referred to as a wafer support pedestal). The heater 525 can be controllably moved between a lower position, where a wafer can be loaded or unloaded, for example, and a processing position closely adjacent to the gas distribution plate 520, indicated by a dashed line 513, or to other positions for other purposes, such as for an etch or cleaning process. A center board (not shown) includes sensors for providing information on the position of the wafer.

In some embodiments, the gas distribution plate 520 may be of the variety described in either of previously-incorporated U.S. patent application Ser. Nos. 10/057,280 or 10/674,569. These plates improve the uniformity of gas disbursement at the substrate and are particularly advantageous in deposition processes that vary gas concentration ratios. In some examples, the plates work in combination with the vertically moveable heater 525 (or moveable wafer support pedestal) such that deposition gases are released farther from the substrate when the ratio is heavily skewed in one direction (e.g., when the concentration of a silicon-containing gas is small compared to the concentration of an oxidizer-containing gas) and are released closer to the substrate as the concentration changes (e.g., when the concentration of silicon-containing gas in the mixture is higher). In other examples, the orifices of the gas distribution plate are designed to provide more uniform mixing of the gases.

The heater 525 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of the heater 525 exposed to the vacuum chamber 515 are made of a ceramic material, such as aluminum oxide ($Al_2O_3$ or alumina) or aluminum nitride.

Reactive and carrier gases are supplied through the supply line 543 into a gas mixing box (also called a gas mixing block) 527, where they are preferably mixed together and delivered to the gas distribution plate 520. The gas mixing box 527 is preferably a dual input mixing block coupled to a process gas supply line 543 and to a cleaning/etch gas conduit 547. A valve 528 operates to admit or seal gas or plasma from the gas conduit 547 to the gas mixing block 527. The gas conduit 547 receives gases from an integral remote microwave plasma system 555, which has an inlet 557 for receiving input gases. During deposition processing, gas supplied to the plate 520 is vented toward the wafer surface (as indicated by arrows 521), where it may be uniformly distributed radially across the wafer surface, typically in a laminar flow.

Purging gas may be delivered into the vacuum chamber 515 from the plate 520 and/or an inlet port or tube (not shown) through the bottom wall of enclosure assembly 512. The purging gas flows upward from the inlet port past the heater 525 and to an annular pumping channel 540. An exhaust system then exhausts the gas (as indicated by arrows 522) into the annular pumping channel 540 and through an exhaust line 560 to a vacuum system 588, which includes a vacuum pump (not shown). Exhaust gases and entrained particles are drawn from the annular pumping channel 540 through the exhaust line 560 at a rate controlled by a throttle valve system 563.

The remote microwave plasma system 555 can produce a plasma for selected applications, such as chamber cleaning or etching native oxide or residue from a process wafer. Plasma species produced in the remote plasma system 555 from precursors supplied via the input line 557 are sent via the conduit 547 for dispersion through the plate 520 to the vacuum chamber 515. Precursor gases for a cleaning application may include fluorine, chlorine, and other reactive elements. The remote microwave plasma system 555 also may be adapted to deposit plasma-enhanced CVD films by selecting appropriate deposition precursor gases for use in the remote microwave plasma system 555.

The system controller 553 controls activities and operating parameters of the deposition system. The processor 550 executes system control software, such as a computer program stored in a memory 570 coupled to the processor 550. Preferably, the memory 570 may be a hard disk drive, but of course the memory 570 may be other kinds of memory, such as read-only memory or flash memory. In addition to a hard disk drive (e.g., memory 570), the CVD apparatus 510 in a preferred embodiment includes a floppy disk drive and a card rack (not shown).

The processor 550 operates according to system control software programmed to operate the device according to the methods disclosed herein. For example, sets of instructions may dictate the timing, mixture of gases, chamber pressure, chamber temperature, microwave power levels, susceptor position, and other parameters of a particular process. Other computer programs such as those stored on other memory including, for example, a floppy disk or another computer program product inserted in a disk drive or other appropriate drive, may also be used to operate the processor 550 to configure the CVD system 510 into various apparatus.

The processor 550 has a card rack (not shown) that contains a single-board computer, analog and digital input/output boards, interface boards and stepper motor controller boards. Various parts of the CVD system 510 conform to the Versa Modular European (VME) standard which defines board, card cage, and connector dimensions and types. The VME standard also defines the bus structure having a 16-bit data bus and 24-bit address bus.

Figure 5B:
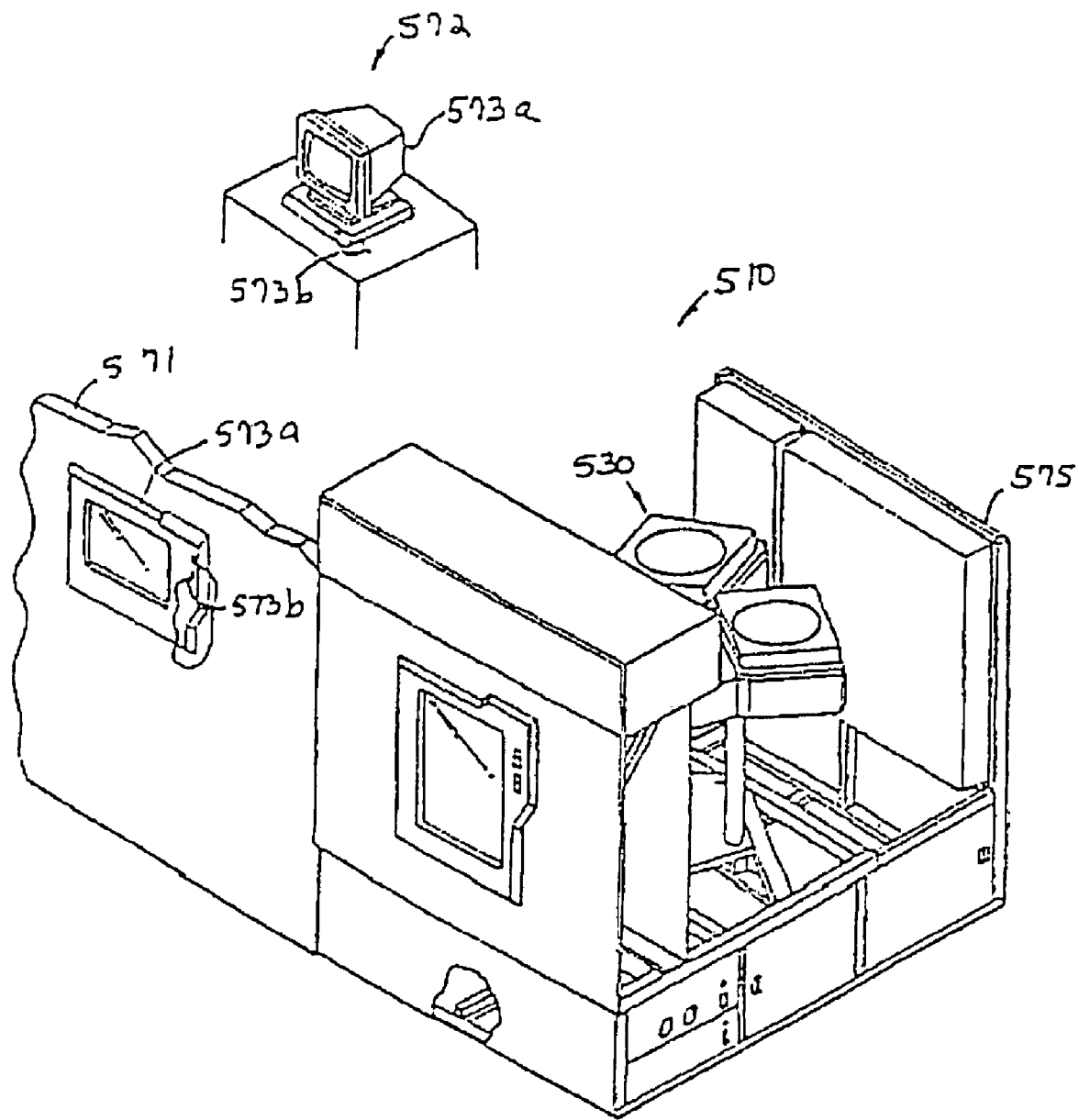
FIG. 5B shows a simplified representation of the user interface for a CVD system in relation to a deposition chamber in a multi-chamber system.

FIG. 5B is a simplified diagram of a user interface in relation to the CVD apparatus chamber 530. The CVD apparatus 510 includes one chamber of a multichamber system. Wafers may be transferred from one chamber to another for additional processing. In some cases the wafers are transferred under vacuum or a selected gas. The interface between a user and the processor is via a CRT monitor 573a and a light pen 573b. A mainframe unit 575 provides electrical, plumbing, and other support functions for the CVD apparatus 510. Exemplary mainframe units compatible with the illustrative embodiment of the CVD apparatus are currently commercially available as the PRECISION 5000™, the CENTURA 5200™, and the PRODUCER SE™ systems from APPLIED MATERIALS, INC. of Santa Clara, Calif.

In some embodiments two monitors 573a are used, one mounted in the clean room wall 571 for the operators, and the other behind the wall 572 for the service technicians. Both monitors 573a simultaneously display the same information, but only one light pen 573b is enabled. The light pen 573b detects light emitted by the CRT display with a light sensor in the tip of the pen. To select a particular screen or function, the operator touches a designated area of the display screen and pushes the button on the pen 573b. The touched area changes its highlighted color, or a new menu or screen is displayed, confirming communication between the light pen and the display screen. Of course, other devices, such as a keyboard, mouse, or other pointing or communication device, may be used instead of or in addition to the light pen 573b to allow the user to communicate with the processor.

Figure 5C:
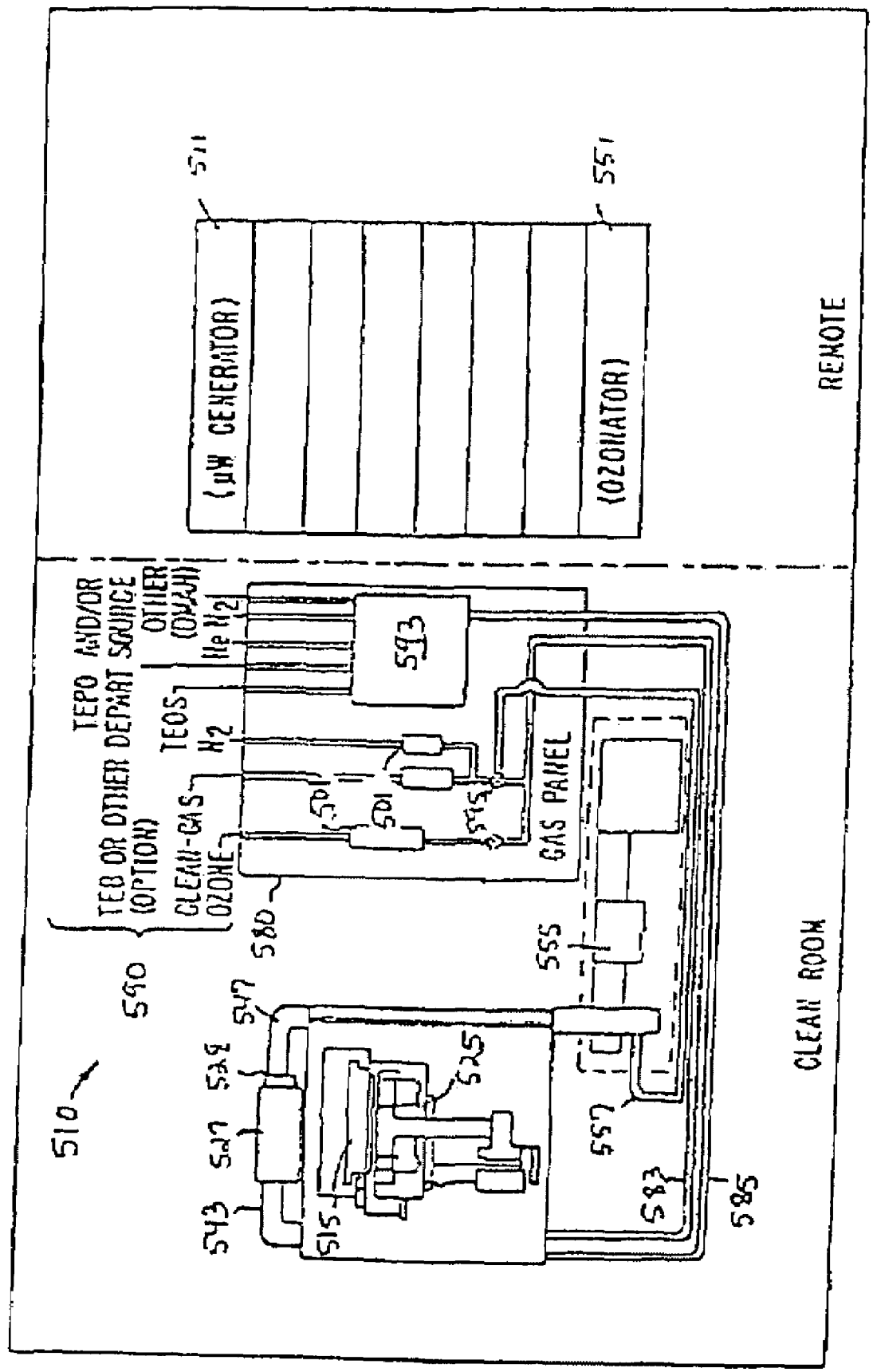
FIG. 5C shows a simplified diagram of a gas panel and supply lines in relation to a deposition chamber.

FIG. 5C illustrates a general overview of an embodiment of the CVD apparatus 510 in relation to a gas supply panel 580 located in a clean room. As discussed above, the CVD system 510 includes a chamber 515 with a heater 525, a gas mixing box 527 with inputs from an inlet tube 543 and a conduit 547, and remote microwave plasma system 555 with input line 557. As mentioned above, the gas mixing box 527 is for mixing and injecting deposition gas(es) and clean gas(es) or other gas(es) through the inlet tube 543 to the processing chamber 515.

The remote microwave plasma system 555 is integrally located and mounted below the chamber 515 with the conduit 547 coming up alongside the chamber 515 to the gate valve 528 and the gas mixing box 527, located above the chamber 515. Microwave generator 511 and ozonator 551 are located remote from the clean room. Supply lines 583 and 585 from the gas supply panel 580 provide reactive gases to the gas supply line 543. The gas supply panel 580 includes lines from gas or liquid sources 590 that provide the process gases for the selected application. The gas supply panel 580 has a mixing system 593 that mixes selected gases before flow to the gas mixing box 527. In some embodiments, gas mixing system 593 includes a liquid injection system for vaporizing reactant liquids such as tetraethylorthosilicate ("TEOS"), triethylborate ("TEB"), and triethylphosphate ("TEPO"). Vapor from the liquids is usually combined with a carrier gas, such as helium. Supply lines for the process gases may include (i) shut-off valves 595 that can be used to automatically or manually shut off the flow of process gas into line 585 or line 557, and (ii) liquid flow meters (LFM) 501 or other types of controllers that measure the flow of gas or liquid through the supply lines.

As an example, a mixture including TEOS as a silicon source may be used with gas mixing system 593 in a deposition process for forming a silicon oxide film. The TEPO is a liquid source that may be vaporized by conventional boiler-type or bubbler-type hot boxes. However, a liquid injection system is preferred as it provides greater control of the volume of reactant liquid introduced into the gas mixing system. The liquid is typically injected as a fine spray or mist into the carrier gas flow before being delivered to a heated gas delivery line 585 to the gas mixing block and chamber. One or more sources, such as oxygen ($O_2$) or ozone ($O_3$) flow to the chamber through another gas delivery line 583, to be combined with the reactant gases from heated gas delivery line 585 near or in the chamber. Of course, it is recognized that other sources of dopants, silicon, and oxygen also may be used.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

What is claimed is:

1. A method of forming a trench isolation in a semiconductor device, the method comprising:
   forming a trench in a substrate;
   forming a material within the trench at a lower deposition rate;
   forming the material on the substrate at a higher deposition rate after the depositing of the material within the trench; and
   annealing the material, wherein, after the annealing, the material in the trench is tensile, and the material at a top end of the trench has less tensile stress than the material at a bottom end of the trench.

2. The method of claim 1, wherein the material formed on the substrate above the trench is compressive after the annealing.

3. The method of claim 1, wherein the material in the trench prior to the annealing has a tensile stress of about 200 MPa or more.

4. The method of claim 1, wherein the material in the trench after the annealing has a tensile stress of about 800 MPa or more.

5. The method of claim 1, wherein the material comprises silicon oxide.

* * * * *